United States Patent [19]

Kumagai et al.

[11] Patent Number: 5,041,327
[45] Date of Patent: Aug. 20, 1991

[54] CERAMIC AND CIRCUIT SUBSTRATE AND ELECTRONIC CIRCUIT SUBSTRATE BY USE THEREOF

[75] Inventors: Motoo Kumagai, Yokohama; Keiichi Kato, Tokyo; Masato Nagano; Michiaki Sakaguchi, both of Iwamisawa, all of Japan

[73] Assignees: Canon Kabushiki Kaisha; Nippon Oil & Fats Co., Ltd., both of Tokyo, Japan

[21] Appl. No.: 513,430

[22] Filed: Apr. 25, 1990

Related U.S. Application Data

[62] Division of Ser. No. 207,201, Jun. 16, 1988, Pat. No. 4,942,079.

[30] Foreign Application Priority Data

Jun. 19, 1987 [JP] Japan .................. 62-153013

[51] Int. Cl.$^5$ ............................................. B32B 9/00
[52] U.S. Cl. ..................................... 428/209; 428/210; 428/426; 428/432; 428/901; 361/397; 361/401
[58] Field of Search ............... 428/209, 210, 426, 432, 428/901; 361/397, 401

[56] References Cited

U.S. PATENT DOCUMENTS

| | | | |
|---|---|---|---|
| 2,648,804 | 8/1953 | Steigerwalt et al. | 361/401 |
| 4,610,969 | 9/1986 | Wada et al. | 501/138 |
| 4,610,970 | 9/1986 | Wada et al. | 510/138 |
| 4,759,965 | 7/1988 | Kato et al. | 428/238 |

FOREIGN PATENT DOCUMENTS

| | | | |
|---|---|---|---|
| 157276 | 10/1985 | European Pat. Off. | 501/136 |
| 88401 | 5/1985 | Japan | 501/136 |
| 107803 | 5/1985 | Japan | 501/136 |
| 107804 | 5/1985 | Japan | 501/136 |

*Primary Examiner*—Patrick J. Ryan
*Assistant Examiner*—Elizabeth Evans
*Attorney, Agent, or Firm*—Fitzpatrick, Cella, Harper & Scinto

[57] ABSTRACT

A ceramic comprising a first region comprises a dielectric porcelain having an insulating layer at the crystal grain boundary of a semiconductor porcelain containing 0.50–5.30 mol parts of $MnO_2$ and 0.02–0.40 mol parts of $Y_2O_3$ per 100 mol parts of a principal components consisting of 49.50–54.00 mol % of $TiO_2$ and 50.50–46.00 mol % of SrO, and a second region comprising a dielectric porcelain containing further 0.40–5.00 mol parts of $Al_2O_3$, based on 100 mol parts of said principal components, in addition to the composition of the first region.

3 Claims, 4 Drawing Sheets

CERAMIC AND CIRCUIT SUBSTRATE AND ELECTRONIC CIRCUIT SUBSTRATE BY USE THEREOF

This application is a division of application Ser. No. 07/207,201 filed June 16, 1988, now U.S. Pat. No. 4,942,079.

BACKGROUND OF THE INVENTION

1. Field of the Invention

This invention relates to a ceramic which can be utilized as the electronic material such as dielectric porcelain substrate, etc. and a circuit substrate and an electronic circuit substrate using the ceramic.

2. Related Background Art

In the prior art, an electronic circuit substrate has been constituted by providing only a conductor circuit, a conductor circuit and a resistance, or a conductor circuit, a resistance and a capacitor within the limited range, and other functional portions mounted as a device as separated from the substrate.

Figure 1:
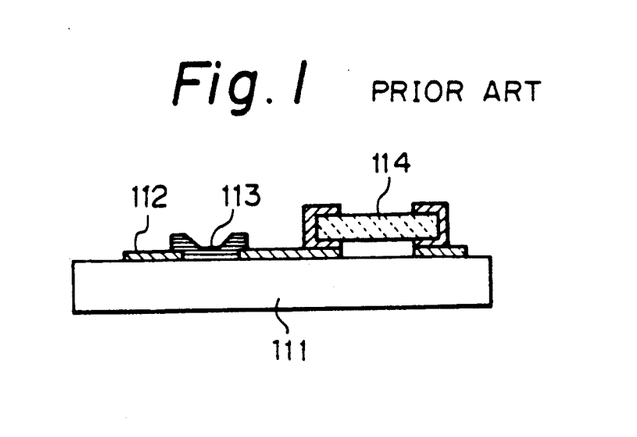
FIG. 1 is a schematic sectional view showing a porcelain substrate of the prior art.

More specifically, for example, in the porcelain substrates of the prior art, a substrate having a conductor and a resistor built therein was of the dominant type, and a capacitor was mounted by soldering thereon as a chip member, etc. For this reason, miniaturization of electronic circuits has been limited. FIG. 1 shows an example thereof, in which 111 is a porcelain substrate, 112 a conductor circuit, 113 a resistor and 114 a chip capacitor.

In recent years, attempts have been made to have a plurality of capacitors built in within a substrate by varying the dielectric constants within the same porcelain substrate.

However, in the prior art, it has been very difficult to practice a method for forming different dielectric constant portions within the same substrate. For example, as is self-explanatory when considering cumbersomeness in preparing a laminated ceramic capacitor, a substrate having a plurality of capacitors built therein has not yet been realized or practically applied under the present situation. It has also been a technical task to make portions with high dielectric constants sufficiently separated as the device functional portions to the extent that no influence may be exerted on each other in actuation within the limited structural space.

Further, such problem of building in separately the functional portions concerned with electronic parts or circuit substrates are not limited to dielectric porcelains, but has revealed itself generally in the case of forming two or more of the same kind or different kinds of functional portions within the ceramic.

SUMMARY OF THE INVENTION

A first object of the present invention is to provide a ceramic capable of having a plurality of functional portions built in with sectionalized as sufficiently separated from each other.

A second object of the present invention is to provide a circuit substrate and an electronic circuit substrate capable of having a plurality of electronic part constituent units built in as sufficiently separated from each other as device functional parts, by being constituted of a ceramic capable of having a plurality of functional portions built in with sectionalized as sufficiently separated from each other as mentioned above.

The above first object can be accomplished by a ceramic comprising a first region comprising a dielectric porcelain having an insulating layer at the crystal grain boundary of a semiconductor porcelain containing 0.50–5.30 mol parts of $MnO_2$ and 0.02–0.40 mol parts of $Y_2O_3$ per 100 mol parts of a principal components consisting of 49.50–54.00 mol % of $TiO_2$ and 50.50–46.00 mol % of SrO, and a second region comprising a dielectric porcelain containing further 0.40–5.00 mol parts of $Al_2O_3$, based on 100 mol parts of said principal components, in addition to the composition of the first region.

The above second object can be accomplished by a circuit substrate having electrodes internally of or at the surface of a ceramic comprising a first region comprising a dielectric material porcelain having an insulating layer at the crystal grain boundary of a semiconductor porcelain containing 0.50–5.30 mol parts of $MnO_2$ and 0.02–0.40 mol parts of $Y_2O_3$ per 100 mol parts of a principal components consisting of 49.50–54.00 mol % of $TiO_2$ and 50.50–46.00 mol % of SrO, and a second region comprising a dielectric porcelain containing further 0.40–5.00 mol parts of $Al_2O_3$, based on 100 mol parts of said principal components, in addition to the composition of said first region, and an electronic circuit substrate having electrodes internally of or at the surface of a ceramic comprising a first region comprising a dielectric porcelain having an insulating layer at the crystal grain boundary of a semiconductor porcelain containing 0.50–5.30 mol parts of $MnO_2$ and 0.02–0.40 mol parts of $Y_2O_3$ per 100 mol parts of a principal components consisting of 49.50–54.00 mol % of $TiO_2$ and 50.50–46.00 mol % of SrO, and a second region comprising a dielectric porcelain containing further 0.40–5.00 mol parts of $Al_2O_3$, based on 100 mol parts of said principal components, in addition to the composition of the first region, and having an electronic circuit part mounted on the ceramic.

DESCRIPTION OF THE PREFERRED EMBODIMENTS

When the ceramic of the present invention is utilized as, for example, electronic material ceramic, the above functional portion capable of being built in within the ceramic of the present invention may include, for example, electronic part constituting units such as dielectric material constituting a condensor, conductor, semiconductor, resistor, insulator, diode, transistor, etc. In the present invention, these functional portions can be formed in the above first region or the second region, and also can be formed in a combination of these regions, a combination of these regions with other regions than these, or even in a region other than these regions.

Also, for example, by arranging two or more of the above first regions separated from each other with the above second region interposed therebetween, or contrariwise by arranging two or more of the above second regions separated from each other with the above first region interposed therebetween, two or more functional regions constituted of the above first region or the second region can be formed as separated sufficiently from each other. Also, both of the first region and the second region can be used as functional portions.

Figure 2:
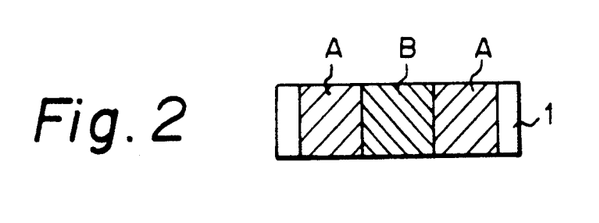
FIG. 2 through FIG. 4 are schematic sectional views showing the shape examples of the first region and the second region of the ceramic of the present invention, respectively.
Figure 3:
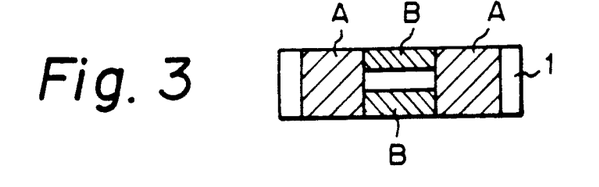
Figure 4:
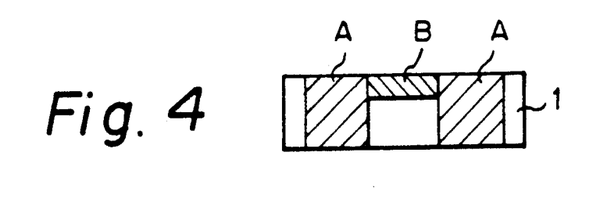

As an example of the ceramic of the present invention, for the plate-shaped dielectric porcelain substrate, shape examples of the above first region and the second region are shown in FIGS. 2 to 4. Here, it is supposed that the functional portion is constituted of the first region. In the examples shown in FIGS. 2 to 4, 1 is a plate-shaped dielectric porcelain substrate, A the first region and B the second region.

In FIG. 2, the second region B with a rectangular cross-section reaching the both main surfaces of the plate-shaped dielectric porcelain substrate are provided, and the two first regions A, A separated from each other are provided with the region B sandwiched therebetween.

In the example shown in FIG. 3, the second regions B, B with rectangular cross-sections are provided occupying the respective surface layer portions of the both main surfaces of the porcelain 1, and the two first regions A, A separated from each other are provided with these regions B, B sandwiched therebetween.

In the example shown in FIG. 4, the second region B with a rectangular cross-section is provided occupying the surface layer portion of one main surface of the porcelain 1, and the two first regions separated from each other A, A are provided with the region B sandwiched therebetween.

In the examples shown in FIG. 2 to FIG. 4, one or two of the second regions B are provided, but this is not limitative of the present invention, but the number can be determined depending on the desired number of the functional portions (first regions), and 3 or more regions can be also provided, as a matter of course.

When the above first region is made the region for the dielectric material for constituting a capacitor, the first dielectric porcelain is required to have high dielectric constant, and it is also desirable in combination with this requirement that the characteristics of the dielectric material itself or those when constituting a capacitor such as dielectric loss, temperature depending change rate of capacitance, etc. should be practically preferable.

In this case, the dielectric constant of the first dielectric porcelain should be preferably 35,000 or higher. With such dielectric constant, even when the condition in shape of the ceramic may be taken into account, a capacitor with a capacitance to the extent of about 0.047 $\mu$F can be formed, and when applied to, for example, a video circuit, etc., about half of the kinds of ceramic chip capacitors generally employed can be formed within the ceramic.

When the first region is thus utilized as the higher dielectric material region, the first dielectric porcelain should preferably be made to have a dielectric constant of 10 or more fold of that of the second dielectric porcelain. This is a performance demanded for removing the mutual influence between the functional portions, and creation of a difference in dielectric constant of 10-fold or more will be very advantageous in miniaturization of the circuit.

When the above first region is made the higher dielectric region, as the porcelain constituting the first region, a composition having firstly a high dielectric constant, and having secondly good performances such as tan $\delta$, temperature characteristics, etc. is preferred. As the material satisfying these requirements, semiconductor porcelains having insulated crystal grain boundaries have been known. As the additive for insulating crystal grain boundaries, any of conventional additives for forming insulating layers at crystal grain boundaries of semiconductor porcelains can be utilized. Suitable additives include oxides of iron, cobalt, bismuth, vanadium, chromium, lead, copper, sodium, etc. The preferred additives include bismuth oxide or sodium oxide.

In recent years, as the semiconductor porcelain of this kind, those containing, strontium titanate as the main component have been frequently used.

Here, the semiconductor porcelain comprising 0.5–5.3 mol parts of $MnO_2$ and 0.02–0.40 mol parts of $Y_2O_3$ added to 100 mol parts of the main components comprising 49.50–54.00 mol % of $TiO_2$ and 50.50–46.00 mol % of SrO with its crystal grain boundary being insulated with $Bi_2O_3$, etc. has good dielectric characteristics as:

(1) dielectric constant=35000–140000;
(2) tan $\leqq$ 2%;
(3) the temperature depending change of dielectric constant within $\pm 15\%$ in the temperature range of $-25°$ C. to $+85°$ C.

In such a semiconductor porcelain, $TiO_2$ and SrO which are the main components can exist in the composition as compound oxides such as solid solution, sole oxides respectively of $TiO_2$ and SrO, or a mixture of these. The quantitative ratio of $TiO_2$ to SrO in the composition is made 49.50–54.00 mol % for $TiO_2$ and 50.50–46.00 mol % for SrO, because if the amount of $TiO_2$ becomes too much, namely the amount of SrO is too small, the dielectric porcelain to be obtained is lowered in dielectric constant, whereby dielectric loss and temperature change of dielectric constant become greater and yet the insulating resistance of the porcelain is reduced. If the amount of $TiO_2$ becomes smaller, namely the amount of SrO becomes larger, the dielectric constant of the dielectric porcelain to be obtained is lowered and the temperature change of the dielectric constant becomes larger. The quantitative ratio of $TiO_2$ to SrO in the composition of the present invention is determined for optimally exhibiting the desired characteristics such as these dielectric constant, dielectric loss, temperature change of dielectric constant, insulating resistance of porcelain, ability to be semiconductivized, etc. with good balance.

In the ceramic of the present invention, $MnO_2$ plays a role as the sintering aid for forming a porcelain, and its amount to be used is limited to 0.50 mol parts or more per 100 mol parts of the above main components comprising $TiO_2$ and SrO, because if $MnO_2$ is less than 0.50 mol parts, the dielectric constant of the dielectric porcelain to be obtained is lowered and also the temperature change of the dielectric constant becomes greater. The amount is also limited to 5.30 mol parts or lower per 100 mol parts of the above main components comprising $TiO_2$ and SrO, because if $MnO_2$ exceeds 5.30 mol parts, the dielectric loss will be increased remarkably.

Next, in the ceramic of the present invention, $Y_2O_3$ has the effect of semiconductivizing the porcelain, and its amount to be used is limited to 0.02 mol parts or more per 100 mol parts of the above main components comprising $TiO_2$ and SrO, because if $Y_2O_3$ is less than 0.02 mol parts, the semiconductivization is not sufficiently effected and the dielectric constant is lowered. The amount is limited to 0.40 mol parts or less per 100 mol parts of the above main components of $TiO_2$ and SrO, because if $Y_2O_3$ exceeds 0.4 mol parts, the dielectric constant is lowered and the dielectric loss becomes greater.

One specific feature of the present invention resides in making the second dielectric porcelain constituting the second region a porcelain with different dielectric constant from the first region through existence of $Al_2O_3$.

For permitting the first and the second dielectric porcelains to exist in a ceramic as an integrated structure, they are required to have reactivity at the boundary therebetween, and also it is contrariwise desirable that the reactivity should not be too great so that no deformation may occur at the bonded portion, the strength distribution may not be greatly changed, and the stress may not be included.

The present invention utilizes the property that the electrical characteristics of the porcelain can be changed greatly by the addition of $Al_2O_3$, whereby it has been rendered possible to separate the functional portions within a ceramic. For example, as described in detail in Reference examples shown below, when the amount of $Al_2O_3$ to be added is changed minutely, it was confirmed that the dielectric constant was remarkably changed between the orders of some hundred and some ten thousands. Accordingly, without changing the compositions of porcelains to great extent, they can be built in within the same ceramic by sectionalizing areas with different dielectric constants.

An example of the method for preparing the ceramic of the present invention is described below. Here, the porcelain forming composition for constituting the semiconductor porcelain of the above first region is called $C_1$ and the porcelain forming composition for constituting the above second region is called $C_2$.

Figure 7:
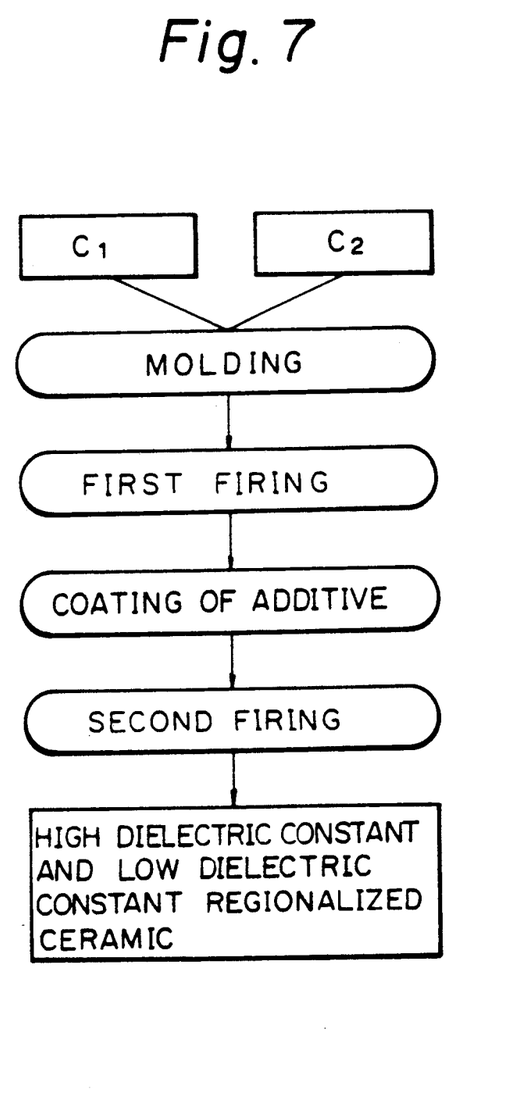
FIG. 7 is a diagram for illustration of the steps for preparation of the ceramic.

This preparation example can be conducted according to the steps as shown in FIG. 7.

Figure 5:
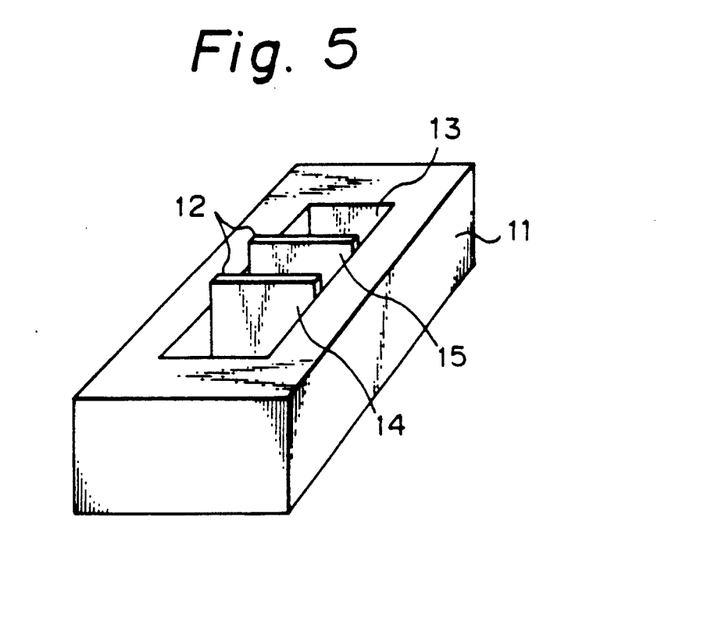
FIG. 5 is a schematic perspective view of a mold for preparing the ceramic of the present invention, FIG. 6 a schematic perspective view of the ceramic prepared by use of the molded product obtained with the mold shown in FIG. 5 as the starting material.
Figure 6:
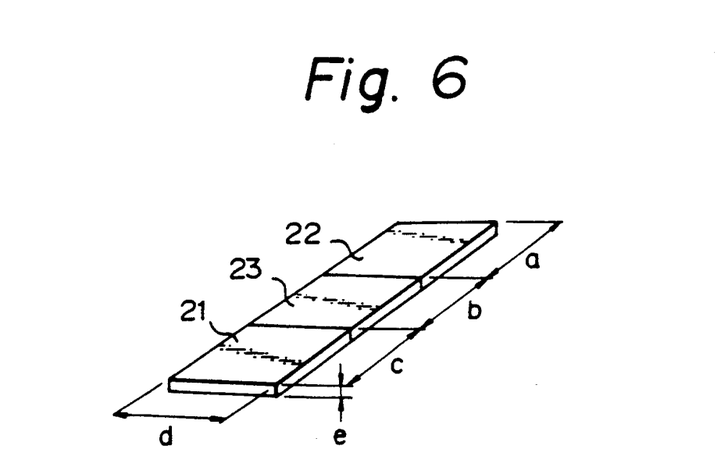

More specifically, a detachable partitioning plates 12 are provided in a mold 11 as shown in FIG. 5, $C_1$ is filled in 13, 14, and $C_2$ in 15, followed by removal of the partitioning plates. Then, pressure molding is performed. Here, the molded product is shown in FIG. 6. 21, 22 are constituted of packed particles of $C_1$ and 23 of packed particles of $C_2$, respectively. In FIG. 6, for example, a was made equal to 3 mm, b=2 mm, c=3 mm, d=10 mm and e(thickness)=0.55 mm. The molded product was subjected to first firing to effect semiconductivization, and subsequently, for example, coated with an additive which becomes the component to be diffused to crystal grain boundaries, on the surface of the semiconductor porcelain thus obtained, followed by second firing to form an insulating layer at the crystal grain boundary of the semiconductor porcelain, thus forming a dielectric material porcelain.

Figures 8A, 8B:
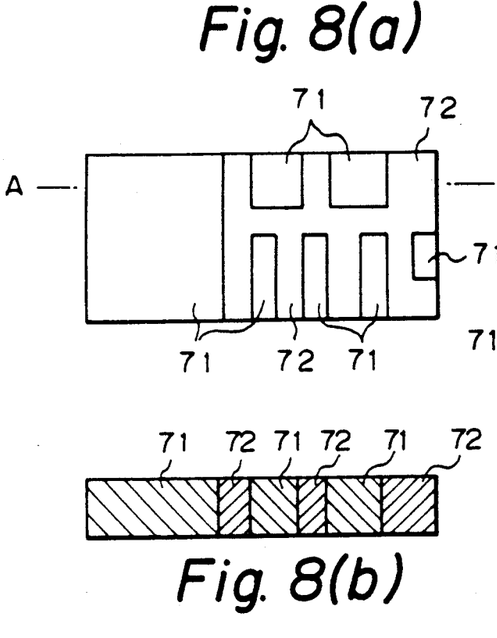
FIG. 8(a) is a plan view showing the constitutional example of the ceramic of the present invention.
FIG. 8(b) is a cross-sectional view along A—A in FIG. 8(a).

One shape example of the ceramic of the present invention is shown in FIG. 8(a) (plan view), FIG. 8(b) (A—A cross-sectional view in FIG. 8(a)).

The ceramic shown in FIG. 8(a) and 8(b) has a plurality of regions with higher dielectric constant 71, 71, 71 ... formed as sectionalized from each other internally of the plate-shaped dielectric porcelain 1, and these regions are mutually separated with the regions with lower dielectric constant 72, 72, 72 ...

Next, the circuit substrate of the present invention is characterized by having at least electrodes internally of or at the surface of the ceramic of the present invention, and having, if desired, at least one functional portion of a conductor, a resistor and an insulator, etc.

Figure 9:
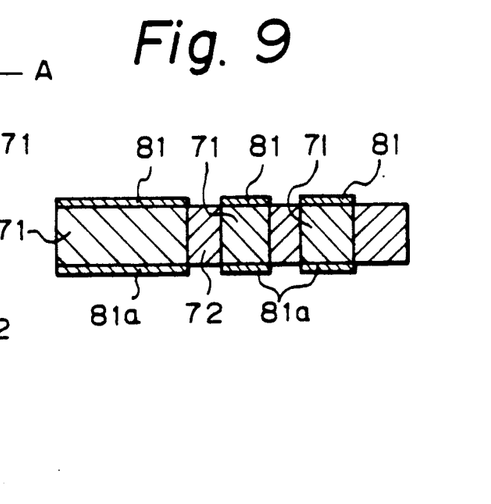
FIG. 9 and FIG. 10 are each schematic sectional view showing a constitutional example of the circuit substrate of the present invention.

As a constituent example, when the same elements are represented by the same symbols, the circuit substrate shown in FIG. 9 has a group of pairs of electrodes 81, 81a, 81, 81a, 81, 81a, constituted of film-like electroconductive paste such as silver paste, etc. on both main surfaces of the respective regions with high dielectric constant on the ceramic shown in FIGS. 8(a) and 8(b).

Figure 10:
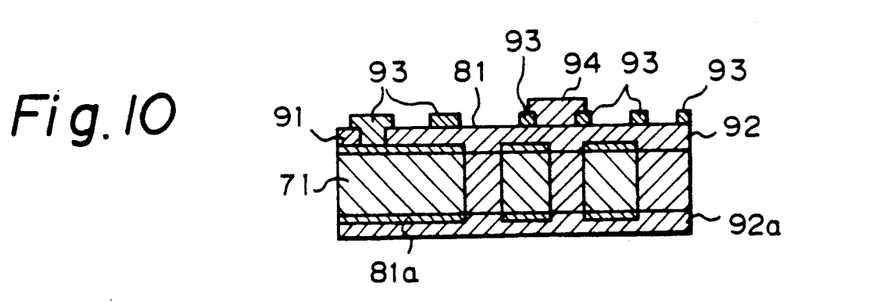

The example of a circuit substrate shown in FIG. 10 is further provided with the insulating layers 92, 92a with via hole portion 91 remained optionally by screen printing of an insulating paste such as glass, etc., a conductor circuit portion 93 printed within the via hole 91 and on the insulating layer, and a resistor portion 94.

Further, the electronic circuit substrate of the present invention is characterized by having electrodes internally of or at the surface of the ceramic of the present invention, and having at least one functional portion of a conductor, a resistor and an insulator, etc. existed and an electronic circuit part mounted on the ceramic, if necessary.

Figure 11:
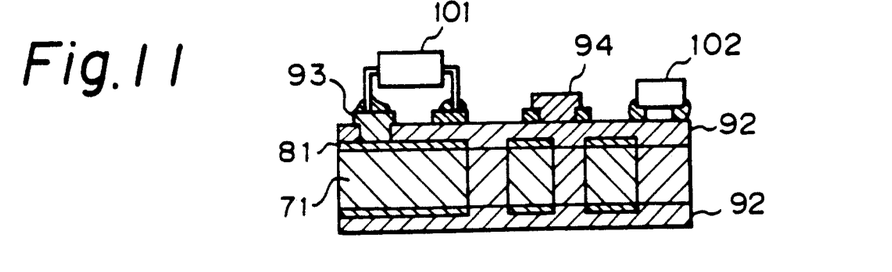
FIG. 11 is a schematic sectional view showing a constitutional example of the electronic circuit substrate of the present invention.

When the same element is represented by the same symbol, for example, the electronic circuit substrate shown in FIG. 11 has a flat package IC 101 and a chip member 102 connected to the conductor circuit portion 93 mounted thereon.

In the following, the present invention is described in more detail by referring to Reference examples and Examples.

The respective starting materials of $TiO_2$, SrO, $MnO_2$ and $Y_2O_3$ were weighed so that the semiconductor porcelain with the compositional ratios shown in Table 1 could be obtained, and pulverized and mixed in a wet system ball mill for 12 hours. The mixture after drying was added with a small amount of polyvinyl alcohol as the binder, granulated into 24 to 80 mesh and molded into discs of 20 mm in diameter and 0.7 mm in thickness by hydraulic pressing. Next, the molded discs were fired in the air at 950° C. for 1 hour to burn the binder. The product was cooled to room temperature and fired in a reducing atmosphere comprising 10 vol. % of hydrogen and 90 vol. % of nitrogen at 1400° C. for 4 hours.

The semiconductor porcelain thus obtained were soaked into a suspension comprising ethyl alcohol and $Bi_2O_3$ or $Na_2O$ in a weight ratio of 10:1, and then fired in an oxidizing atmosphere at 1250° C. for 0.5 hour to form an insulating layer at the crystal grain boundary.

The discs of dielectric porcelain thus obtained (Sample Nos. 1-25) were coated on both surfaces with silver paste, baked at 850° C. for 30 minutes to form electrodes to prepare capacitors.

The dielectric constant ($\epsilon$), the dielectric loss (tan $\delta$), the insulating resistance (IR) and the temperature characteristic of dielectric constant (temperature depending change rates at $-25°$ C. and $+85°$ C. with 25° C. as the standard) of the dielectric porcelain constituting the capacitor thus obtained were measured to obtain the results shown in Table 1. The measurement conditions were 25° C. and a frequency of 1 kHz. The symbol * in Table 1 shows a sample outside the scope of the present invention.

When $Al_2O_3$ was added to the higher dielectric constant composition (hereinafter called $C_1$), the porcelain crystal grain particle size was reduced and the volume resistivity of the semiconductor porcelain increased with increase of the amount of $Al_2O_3$ added, with the result that the dielectric constant was markedly lowered.

The effects of the addition of $Al_2O_3$ are exemplified in Table 2.

In $C_1$, when the amount of $Al_2O_3$ added is less than 0.40 mol parts per 100 mol parts of the main components ($TiO_2$ 49.50-54.00 mol % and SnO 50.50-46.00 mol %), the ratio of the dielectric constant lowered is small, and the dielectric constant will be lowered to below 500 with addition of about 1.5 mol parts. Further, when the amount added is increased, the dielectric constant is reduced but its tendency is dull, and sinterability will be lowered at the point exceeding 5 mol parts, whereby mechanical strength (as represented by flexural strength) will be undesirably lowered.

Accordingly, during addition of $Al_2O_3$, the amount necessary for obtaining the desired dielectric constant can be determined by experiments at 5 mol parts or less, but addition of 0.40 to 5.00 mol parts is required when the ratio of $\epsilon_1/\epsilon_2$ of the dielectric constant of the first region $\epsilon_1$ to the dielectric constant of the second region $\epsilon_2$ is designed to be 10 or more.

As is apparent from Table 2, it can be understood that the dielectric constant is changed extremely greatly by varying the amount of $Al_2O_3$ added.

Examples 1–6th

Following the illustrative steps shown in FIG. 7, of the dielectric porcelain forming compositions of References 1 to 35 shown in Table 1 and Table 2, the combinations of higher dielectric constant composition ($C_1$) and lower dielectric constant composition ($C_2$) shown in Table 3 were used, and with partitioning plates 12 placed vertically in the mold 11 shown in FIG. 5, the gaps 13, 14 were filled with $C_1$ and the gap 15 with $C_2$, and then semiconductors were formed under the same conditions as in References 1 to 35, followed by formation of a grain boundary insulating layer under the same conditions by use of the same boundary insulating agent as used above for $C_1$ shown in Table 1, to prepare ceramics having two regions with higher dielectric constant 21, 22 separated from each other through a region with lower dielectric constant 23 interposed therebetween as shown in FIG. 6.

On the both main surfaces of the regions 21, 22 with higher dielectric constants of the ceramic thus obtained, electrodes were formed in the same manner as in References, and the capacitor characteristics were measured. The results are shown in Table 3.

As is apparent from the above description, the ceramic according to the present invention can have a plurality of capacitor functional portions as sufficiently separated from each other.

TABLE 1

| Sample No. | Composition of main components (mol %) TiO$_2$ | SrO | Contents of other components (mol parts per 100 mol parts of main components) MnO$_2$ | Y$_2$O$_3$ | Additive for formation of insulating layer | $\epsilon$ | tan$\delta$ (%) | IR (M$\Omega$) | Temperature change rate of dielectric constant (%, based on 25° C.) −25° C. | +85° C. |
|---|---|---|---|---|---|---|---|---|---|---|
| 1* | 49.20 | 50.80 | 3.50 | 0.12 | Bi$_2$O$_3$ | 22000 | 0.9 | 7100 | 13.8 | −12.7 |
| 2 | 49.70 | 50.30 | 3.50 | 0.12 | ↑ | 47000 | 0.8 | 5600 | 12.1 | −10.3 |
| 3 | 50.20 | 49.80 | 3.50 | 0.12 | ↑ | 119000 | 0.7 | 4700 | 9.7 | −10.0 |
| 4 | 51.00 | 49.00 | 3.50 | 0.12 | ↑ | 132000 | 0.7 | 4300 | 8.2 | −6.8 |
| 5 | 53.40 | 46.60 | 3.50 | 0.12 | ↑ | 101000 | 0.8 | 3900 | 9.1 | −7.9 |
| 6 | 53.60 | 46.40 | 3.50 | 0.12 | ↑ | 89000 | 1.3 | 3100 | 10.2 | −9.8 |
| 7* | 54.20 | 45.80 | 3.50 | 0.12 | ↑ | 20000 | 2.3 | 1500 | 10.0 | −9.5 |
| 8* | 51.00 | 49.00 | 0.30 | 0.12 | ↑ | 31000 | 0.7 | 9600 | 14.1 | −13.2 |
| 9 | 51.00 | 49.00 | 0.70 | 0.12 | ↑ | 40000 | 0.7 | 8200 | 13.6 | −13.0 |
| 10 | 51.00 | 49.00 | 2.10 | 0.12 | ↑ | 118000 | 0.6 | 4100 | 8.1 | −7.8 |
| 11 | 51.00 | 49.00 | 3.00 | 0.12 | ↑ | 134000 | 0.5 | 3900 | 7.5 | −7.3 |
| 12 | 51.00 | 49.00 | 4.80 | 0.12 | ↑ | 111000 | 0.8 | 4200 | 8.2 | −8.1 |
| 13 | 51.00 | 49.00 | 5.10 | 0.12 | Bi$_2$O$_3$ | 92000 | 1.9 | 4300 | 8.5 | −7.8 |
| 14* | 51.00 | 49.00 | 5.50 | 0.12 | ↑ | 67000 | 3.2 | 4500 | 8.4 | −8.5 |
| 15* | 51.00 | 49.00 | 3.50 | 0.01 | ↑ | 21000 | 0.5 | 9600 | 8.0 | −8.6 |
| 16 | 51.00 | 49.00 | 3.50 | 0.03 | ↑ | 62000 | 0.5 | 8300 | 7.9 | −8.2 |
| 17 | 51.00 | 49.00 | 3.50 | 0.06 | ↑ | 106000 | 0.6 | 6700 | 7.6 | −8.3 |
| 18 | 51.00 | 49.00 | 3.50 | 0.20 | ↑ | 115000 | 0.8 | 3500 | 6.9 | −7.4 |
| 19 | 51.00 | 49.00 | 3.50 | 0.27 | ↑ | 108000 | 0.9 | 3200 | 7.8 | −8.0 |
| 20 | 51.00 | 49.00 | 3.50 | 0.37 | ↑ | 67000 | 1.9 | 1700 | 7.8 | −7.5 |
| 21* | 51.00 | 49.00 | 3.50 | 0.42 | ↑ | 48000 | 2.8 | 1100 | 7.9 | −8.1 |
| 22 | 51.00 | 49.00 | 2.10 | 0.12 | Na$_2$O | 140000 | 0.6 | 3900 | 7.4 | −6.3 |
| 23 | 51.00 | 49.00 | 3.00 | 0.12 | ↑ | 144000 | 0.7 | 3500 | 6.8 | −8.2 |
| 24 | 51.00 | 49.00 | 4.80 | 0.12 | ↑ | 128000 | 0.8 | 3400 | 7.4 | −8.1 |

*outside the range of the present invention

TABLE 2

| Sample No. | Composition of main components (mol %) | | Contents of other components (mol parts per 100 mol parts of main components) | | | additive for formation of insulating layer | $\epsilon$ | tan$\delta$ (%) | IR (M$\Omega$) | Average particle diameter of porcelain ($\mu$) | Volume resistivity of semiconductor porcelain ($\Omega \cdot$ cm) | Flexural strength (kg/cm$^2$) |
|---|---|---|---|---|---|---|---|---|---|---|---|---|
| | TiO$_2$ | SrO | MnO$_2$ | Y$_2$O$_3$ | Al$_2$O$_3$ | | | | | | | |
| 24 | 51.00 | 49.00 | 3.50 | 0.12 | — | Bi$_2$O$_3$ | 132000 | 0.7 | 4300 | 64 | 3 × 10$^1$ | 1500 |
| 25 | " | " | " | " | 0.2 | " | 86000 | 0.7 | 4800 | 46 | 4 × 10$^2$ | 1600 |
| 26 | " | " | " | " | 0.5 | " | 11000 | 0.9 | 6700 | 30 | 3 × 10$^4$ | 1700 |
| 27 | " | " | " | " | 1.5 | " | 430 | 1.0 | 8600 | 14 | 8 × 10$^5$ | 1900 |
| 28 | " | " | " | " | 4.5 | " | 330 | 1.2 | 9100 | 6 | 2 × 10$^6$ | 1700 |
| 29 | " | " | " | " | 5.5 | " | 310 | 1.4 | 9300 | 4 | 5 × 10$^6$ | 1100 |
| 30 | 49.70 | 50.30 | 3.50 | 0.12 | 1.5 | " | 390 | 1.0 | 9200 | 10 | 7 × 10$^6$ | 1900 |
| 31 | 53.60 | 46.40 | 3.50 | 0.12 | 1.5 | " | 450 | 1.6 | 8000 | 15 | 2 × 10$^5$ | 1700 |
| 32 | 51.00 | 49.00 | 0.70 | 0.12 | 1.5 | " | 380 | 0.9 | 11000 | 9 | 7 × 10$^5$ | 2100 |
| 33 | 51.00 | 49.00 | 5.10 | 0.12 | 1.5 | " | 410 | 1.7 | 9400 | 12 | 1 × 10$^6$ | 1700 |
| 34 | 51.00 | 49.00 | 3.50 | 0.03 | 1.5 | " | 370 | 0.9 | 10000 | 16 | 9 × 10$^6$ | 1700 |
| 35 | 51.00 | 49.00 | 3.50 | 0.37 | 1.5 | " | 380 | 1.5 | 5900 | 10 | 3 × 10$^5$ | 1800 |

TABLE 3

| Example No. | Higher dielectric constant region composition C$_1$ | | Lower dielectric constant region composition C$_2$ | Portion of 21 | | Portion of 22 | | Portions of 21–22 $\oplus$ |
|---|---|---|---|---|---|---|---|---|
| | Portion of 21 | Portion of 22 | Portion of 23 | C(nF) | tan$\delta$(%) | C(nF) | tan$\delta$(%) | C(pF) |
| 1* | same as Sample No. 4 | ← | ← | 63 | 0.8 | 62 | 0.7 | 3700 |
| 2* | " | ← | same as Sample No. 25 | 62 | 0.7 | 62 | 0.8 | 2800 |
| 3 | " | ← | same as Sample No. 26 | 63 | 0.7 | 62 | 0.8 | 320 |
| 4 | " | ← | same as Sample No. 27 | 62 | 0.8 | 61 | 0.7 | 29 |
| 5 | " | ← | same as Sample No. 28 | 61 | 0.9 | 61 | 0.9 | 25 |
| 6* | " | ← | same as Sample No. 29 | 59 | 1.0 | 58 | 1.0 | 24 |

$\oplus$: the volume interposed between the electrode of the portion 21 and the electrode of the portion 22 shown in FIG. 6
*outside the range of the present invention According to the ceramic of the present invention, a plurality of functional portions can be built in under the state sufficiently separated from each other.

Also, according to the circuit substrate and the electronic circuit substrate of the present invention, by being constituted of a ceramic capable of having a plurality of functional portions built therein as sectionalized under the state sufficiently separated from each other as described above, a plurality of electronic part constituent units can be built in under the state sufficiently separated mutually as the device functional portions from each other.

What is claimed is:

1. An electronic circuit substrate having electrodes internally of or at the surface of a ceramic comprising a first region comprising a dielectric porcelain having an insulating layer at the crystal grain boundary of a semiconductor porcelain containing 0.50–5.30 mol parts of MnO$_2$ and 0.2–0.40 mol parts of Y$_2$O$_3$ per 100 mol parts of a principal components consisting of 49.50–54.00 mol % of TiO$_2$ and 50.50–46.00 mol % of SrO, and a second region comprising a dielectric porcelain containing further 0.40–5.00 mol parts of Al$_2$O$_3$, based on 100 mol parts of said principal components, in addition to the composition of the first region, and having an electronic circuit part mounted on the ceramic.

2. An electronic circuit substrate according to claim 1, wherein the dielectric porcelain of said first region has a dielectric constant which is 10-fold or more of the dielectric constant of the dielectric porcelain of said second region.

3. An electronic circuit substrate according to claim 1, wherein said ceramic further comprises at least one selected from iron oxide, cobalt oxide, vanadium oxide, chromium oxide, lead oxide, copper oxide, bismuth oxide and sodium oxide.

* * * * *

UNITED STATES PATENT AND TRADEMARK OFFICE
CERTIFICATE OF CORRECTION

PATENT NO. : 5,041,327

DATED : August 20, 1991

INVENTOR(S) : MOTOO KUMAGAI, ET AL.

It is certified that error appears in the above-identified patent and that said Letters Patent is hereby corrected as shown below:

COLUMN 2

Line 58, "view" should read --views--.

COLUMN 4

Line 27, "containing," should read --containing--.
Line 37, "(2) tan $\leq$ 2%;" should read --(2) tan $\delta \leq$ 2%;--.

COLUMN 5

Line 54, "a" should be deleted.

COLUMN 6

Line 10, "with" (first occurrence) should read --from--.

UNITED STATES PATENT AND TRADEMARK OFFICE
CERTIFICATE OF CORRECTION

PATENT NO. : 5,041,327

DATED : August 20, 1991

INVENTOR(S) : MOTOO KUMAGAI, ET AL.

It is certified that error appears in the above-identified patent and that said Letters Patent is hereby corrected as shown below:

COLUMN 9

Line 50, "0.2-0.40 mol parts" should read --0.02-0.40 mol parts--.

Signed and Sealed this

Thirtieth Day of March, 1993

Attest:

STEPHEN G. KUNIN

Attesting Officer

Acting Commissioner of Patents and Trademarks